United States Patent
Kim

(10) Patent No.: US 10,848,701 B2
(45) Date of Patent: Nov. 24, 2020

(54) IMAGE SENSING DEVICE

(71) Applicant: SK hynix Inc., Gyeonggi-do (KR)

(72) Inventor: Tae-Gyu Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 43 days.

(21) Appl. No.: 16/190,984

(22) Filed: Nov. 14, 2018

(65) Prior Publication Data

US 2019/0313041 A1 Oct. 10, 2019

(30) Foreign Application Priority Data

Apr. 6, 2018 (KR) .......................... 10-2018-0040204

(51) Int. Cl.
| | | |
|---|---|---|
| *H04N 5/378* | (2011.01) | |
| *H03K 4/02* | (2006.01) | |
| *H03M 1/16* | (2006.01) | |
| *H04N 5/3745* | (2011.01) | |

(52) U.S. Cl.
CPC ............. *H04N 5/378* (2013.01); *H03K 4/026* (2013.01); *H03M 1/162* (2013.01); *H04N 5/37455* (2013.01)

(58) Field of Classification Search
CPC ........ H03K 4/026; H03M 1/162; H03M 1/56; H04N 5/37455; H04N 5/378
See application file for complete search history.

(56) References Cited

U.S. PATENT DOCUMENTS

| | | | | |
|---|---|---|---|---|
| 8,723,998 | B2 * | 5/2014 | Maruta | H04N 5/378 |
| | | | | 348/294 |
| 10,205,463 | B1 * | 2/2019 | Milkov | H03M 1/1295 |
| 2011/0001039 | A1 * | 1/2011 | Hoshino | H04N 5/3742 |
| | | | | 250/208.1 |
| 2011/0114827 | A1 * | 5/2011 | Yamaoka | H03K 7/08 |
| | | | | 250/214 R |
| 2012/0008028 | A1 * | 1/2012 | Egawa | H04N 5/378 |
| | | | | 348/300 |
| 2012/0113286 | A1 * | 5/2012 | Lim | H03M 1/144 |
| | | | | 348/222.1 |
| 2012/0293232 | A1 * | 11/2012 | Guyton | H03M 1/56 |
| | | | | 327/337 |
| 2015/0350585 | A1 * | 12/2015 | Kim | H03M 1/1014 |
| | | | | 348/308 |

FOREIGN PATENT DOCUMENTS

| | | |
|---|---|---|
| JP | 5181087 | 4/2013 |
| KR | 101648066 | 8/2016 |

* cited by examiner

*Primary Examiner* — Amy R Hsu
(74) *Attorney, Agent, or Firm* — IP & T Group LLP

(57) ABSTRACT

An image sensing device includes: a first source ramp voltage generation circuit suitable for generating a first source ramp voltage that is adjusted a first voltage unit for each first period, a second source ramp voltage generation circuit suitable for generating a second source ramp voltage that is adjusted the first voltage unit for each first period and has a set voltage difference from the first source ramp voltage, and a ramp voltage generation circuit suitable for generating a ramp voltage that is adjusted a second voltage unit that is less than the first voltage unit for each second period that is shorter than the first period based on the first and second source ramp voltages and a plurality of first control signals.

20 Claims, 3 Drawing Sheets

IMAGE SENSING DEVICE

CROSS-REFERENCE TO RELATED APPLICATION

This application claims priority under 35 U.S.C. § 119 to Korean Patent Application No. 10-2018-0040204, filed on Apr. 6, 2018, in the Korean Intellectual Property Office, the disclosure of which is incorporated herein by reference in its entirety.

BACKGROUND

1. Field

Various embodiments of the present invention relate to a semiconductor design technique, and more particularly, to an image sensing device.

2. Description of the Related Art

Image sensing devices capture images using photosensitive properties of semiconductors. Image sensing devices are often classified into charge-coupled device (CCD) image sensors and complementary metal-oxide semiconductor (CMOS) image sensors. CMOS image sensors allow both analog and digital control circuits to be integrated in a single integrated circuit (IC), making CMOS image sensors the most widely used type of image sensor.

SUMMARY

Various embodiments of the present invention are directed to an image sensing device capable of generating and using a ramp voltage having stable stepped waveforms.

In accordance with an embodiment of the present invention, an image sensing device includes: a first source ramp voltage generation circuit suitable for generating a first source ramp voltage that is adjusted a first voltage unit for each first period; a second source ramp voltage generation circuit suitable for generating a second source ramp voltage that is adjusted the first voltage unit for each first period and has a set voltage difference from the first source ramp voltage; and a ramp voltage generation circuit suitable for generating a ramp voltage that is adjusted a second voltage unit that is less than the first voltage unit for each second period that is shorter than the first period based on the first and second source ramp voltages and a plurality of first control signals.

The set voltage difference may correspond to half of the first voltage level.

The first source ramp voltage and the second source ramp voltage may have a set phase difference.

The set phase difference may correspond to half of the first period.

The first source ramp voltage may have a level greater than that of the second source ramp voltage for an initial portion of the first period and have a level less than that of the second source ramp voltage for a last portion of the first period.

The ramp voltage may have a voltage level between the first source ramp voltage and the second source ramp voltage.

The ramp voltage generation circuit may include: a plurality of first switching elements coupled in parallel between a supply node of the first source ramp voltage and an output node of the ramp voltage and sequentially controlled based on the plurality of first control signals; and a plurality of second switching elements coupled in parallel between a supply node of the second source ramp voltage and the output node of the ramp voltage and sequentially controlled based on a plurality of second control signals, which are inverted signals of the first control signals.

The first control signals may be repeatedly generated for each first period and sequentially activated or deactivated for each second period.

In accordance with an embodiment of the present invention, an image sensing device includes: a first source ramp voltage generation circuit suitable for generating a first source ramp voltage that is adjusted a coarse voltage unit for each coarse period and outputting the first source ramp voltage to a first supply node; a second source ramp voltage generation circuit suitable for generating a second source ramp voltage that is adjusted the coarse voltage unit for each coarse period and outputting the second source ramp voltage to a second supply node; and a ramp voltage generation circuit coupled between the first supply node and the second supply node, and suitable for generating a ramp voltage that is adjusted a fine voltage unit for each fine period based on a plurality of first control signals.

The first source ramp voltage and the second source ramp voltage may have a set voltage difference and a set phase difference.

The set voltage difference may correspond to half of the coarse voltage level.

The set phase difference may correspond to half of the coarse period.

The first source ramp voltage may have a level greater than that of the second source ramp voltage for an initial portion of the coarse period and have a level less than that of the second source ramp voltage for a last portion of the coarse period.

The ramp voltage may have a voltage level between the first source ramp voltage and the second source ramp voltage.

The ramp voltage generation circuit may include: a plurality of first switching elements coupled in parallel between the first supply node and an output node of the ramp voltage and sequentially controlled based on the plurality of first control signals; and a plurality of second switching elements coupled in parallel between the second supply node and the output node of the ramp voltage and sequentially controlled based on a plurality of second control signals, which are inverted signals of the first control signals.

The first control signals may be repeatedly generated for each coarse period and sequentially activated or deactivated for each fine period.

In accordance with an embodiment of the present invention, an image sensing device includes: a pixel array suitable for generating a plurality of pixel signals; a ramp voltage generator suitable for generating a ramp voltage that has a voltage level between a first source ramp voltage and a second source ramp voltage and is adjusted a fine voltage unit for each fine period based on the first and second source ramp voltages, which are adjusted a coarse voltage unit for each coarse period; and a signal converter suitable for converting the pixel signals to a plurality of image signals based on the ramp voltage.

The first source ramp voltage may have a level greater than that of the second source ramp voltage for an initial portion of the coarse period and have a level less than the second source ramp voltage for a last portion of the coarse period.

The ramp voltage generator may include: a first source ramp voltage generation circuit suitable for generating the first source ramp voltage and outputting the first source ramp voltage to a first supply node; a second source ramp voltage generation circuit suitable for generating the second source ramp voltage and outputting the second source ramp voltage to a second supply node; and a ramp voltage generation circuit coupled between the first supply node and the second supply node, and suitable for generating the ramp voltage based on a plurality of first control signals.

The ramp voltage generation circuit may include: a plurality of first switching elements coupled in parallel between the first supply node and an output node of the ramp voltage and sequentially controlled based on the plurality of first control signals; and a plurality of second switching elements coupled in parallel between the second supply node and the output node of the ramp voltage and sequentially controlled based on a plurality of second control signals, which are inverted signals of the first control signals.

DETAILED DESCRIPTION

Various embodiments of the present invention will be described below in more detail with reference to the accompanying drawings. These embodiments are provided so that this disclosure is thorough and complete. All "embodiments" referred to in this disclosure refer to embodiments of the inventive concept disclosed herein. The embodiments presented are merely examples and are not intended to limit the scope of the invention. Moreover, throughout the specification reference to "an embodiment" or the like is not necessarily to only one embodiment, and different references to any such phrase is not necessarily to the same embodiment(s).

Moreover, it is noted that the terminology used herein is for the purpose of describing the embodiments and is not intended to be limiting of the invention. As used herein, singular forms are intended to include the plural forms and vice versa, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through one or more intermediate components.

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without departing from the spirit and scope of the present invention.

The drawings are not necessarily to scale and, in some instances, proportions may have been exaggerated in order to clearly illustrate features of the embodiments.

Figure 1:
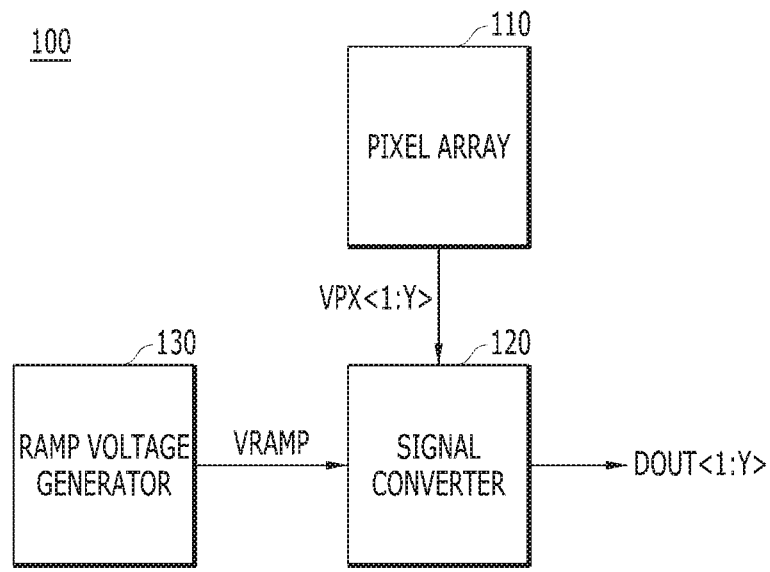
FIG. 1 is a block diagram illustrating an image sensing device in accordance with an embodiment of the present invention.

FIG. 1 is a block diagram illustrating an image sensing device 100 in accordance with an embodiment of the present invention.

Referring to FIG. 1, the image sensing device 100 may include a pixel array 110, a signal converter 120, and a ramp voltage generator 130.

The pixel array 110 may include a plurality of pixels, e.g., IVY pixels (not illustrated) arranged in row and column directions, where N and Y are natural numbers which are the same as or different from each other. The pixel array 110 may sequentially output first to $Y^{th}$ pixel signals VPX<1:Y> in units of rows X times. For example, the pixel array 110 outputs the first to $Y^{th}$ pixel signals VPX<1:Y> from the pixels arranged in each row for each single row period. Each of the first to $Y^{th}$ pixel signals VPX<1:Y> may be an analog signal.

The signal converter 120 may generate first to $Y^{th}$ image signals DOUT<1:Y> corresponding to the first to $Y^{th}$ pixel signals VPX<1:Y> based on a ramp voltage VRAMP and the first to $Y^{th}$ pixel signals VPX<1:Y>. Each of the first to $Y^{th}$ image signals DOUT<1:Y> may be a digital signal.

The ramp voltage generator 130 may generate the ramp voltage VRAMP such that it decreases by steps for each single ramp period corresponding to the single row period. For example, the ramp voltage generator 130 generates source ramp voltages, e.g., first and second source ramp voltages VR1 and VR2 (shown in FIG. 2) and generates the ramp voltage VRAMP having a voltage level between the first and second source ramp voltages VR1 and VR2.

Since the pixel array 110 and the signal converter 120 are widely known to those skilled in the art, detailed descriptions thereof are omitted herein. The ramp voltage generator 130 of the present invention is described in detail.

Figure 2:
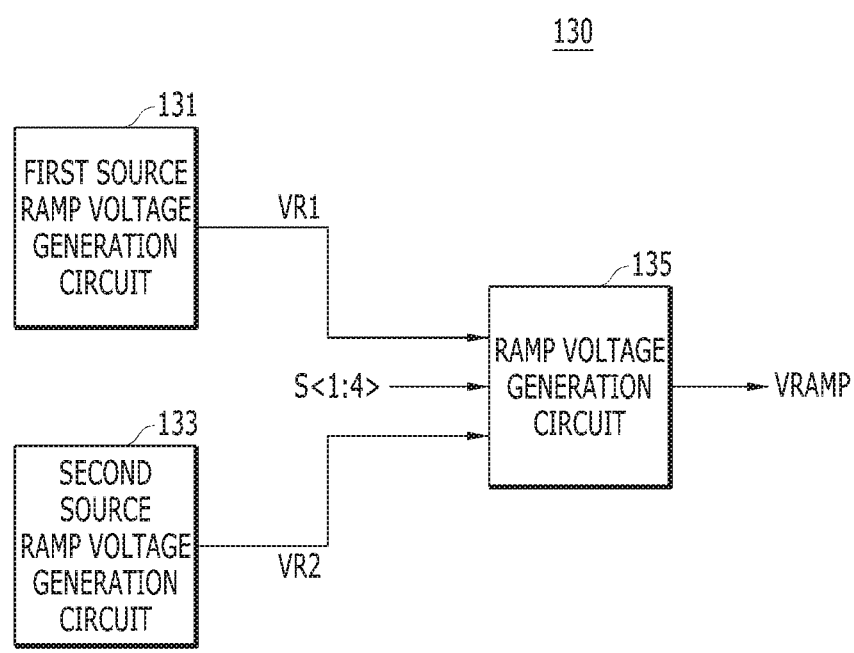
FIG. 2 is a block diagram illustrating a ramp voltage generator in accordance with an embodiment of the present invention.

FIG. 2 is a block diagram illustrating a ramp voltage generator in accordance with an embodiment of the present invention, for example, the ramp voltage generator 130 shown in FIG. 1.

Referring to FIG. 2, the ramp voltage generator 130 may include a first source ramp voltage generation circuit 131, a second source ramp voltage generation circuit 133, and a ramp voltage generation circuit 135.

The first source ramp voltage generation circuit 131 may generate the first source ramp voltage VR1 that has a coarse period and decreases in units of coarse voltage levels, or coarse voltage units. For example, the first source ramp voltage generation circuit 131 includes a variable current-based ramp voltage generation circuit or a variable resistance-based ramp voltage generation circuit.

The second source ramp voltage generation circuit 133 may generate the second source ramp voltage VR2 that has the coarse period and decreases in units of the coarse voltage levels, or coarse voltage units. For example, the second source ramp voltage generation circuit 133 includes the variable current-based ramp voltage generation circuit or the variable resistance-based ramp voltage generation circuit.

The first source ramp voltage VR1 and the second source ramp voltage VR2 may have a voltage level difference and a phase difference, either or both of which may be determined in advance. The voltage level difference may correspond to half of the coarse voltage level. The phase difference may correspond to half of the coarse period. Accordingly, the first source ramp voltage VR1 may have a level greater than the second source ramp voltage VR2 for a first half (i.e., an initial portion or an even-numbered time period) of the coarse period and have a level less than the second source ramp voltage VR2 for a second half (i.e., a last portion or an odd-numbered time period) of the coarse period.

The ramp voltage generation circuit 135 may generate the ramp voltage VRAMP that decreases in units of fine voltage levels, or fine voltage units, for each fine period, based on the first and second source ramp voltages VR1 and VR2 and first to fourth control signals S<1:4>.

Figure 3:
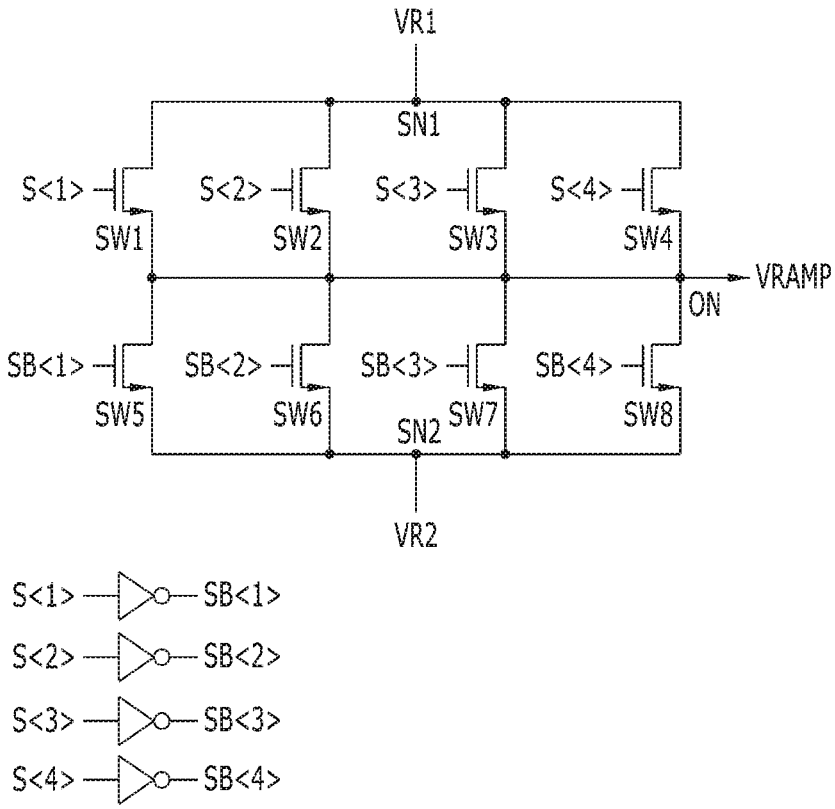
FIG. 3 is a circuit diagram illustrating a ramp voltage generation circuit in accordance with an embodiment of the present invention.
Figure 4:
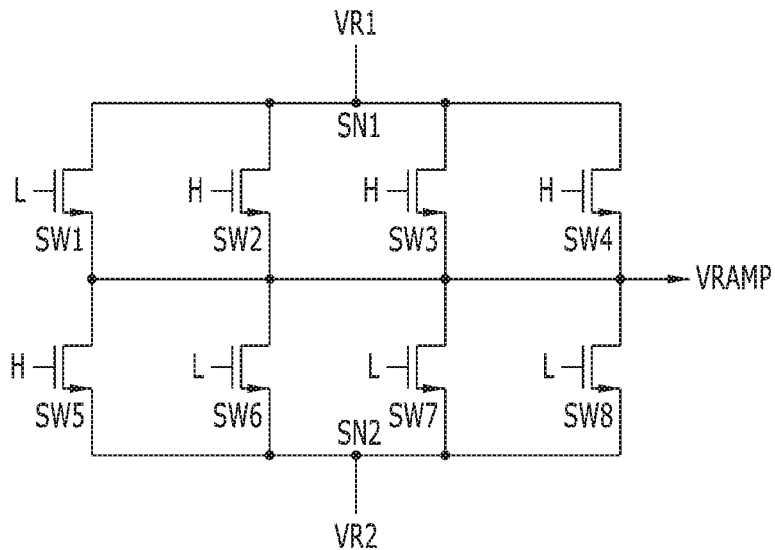
FIG. 4 is a circuit diagram of an exemplary ramp voltage generation circuit in accordance with an embodiment of the present invention.

FIG. 3 is a circuit diagram illustrating a ramp voltage generation circuit in accordance with an embodiment of the present invention, e.g., the ramp voltage generation circuit 135 shown in FIG. 2. FIG. 4 is a circuit diagram further illustrating a ramp voltage generation circuit, e.g., the ramp voltage generation circuit 135 shown in FIG. 3.

Referring to FIG. 3, the ramp voltage generation circuit 135 may include a plurality of switching elements, for example, first to eighth switching elements SW1 to SW8. However, the present invention is not limited to eight switching elements. The ramp voltage generation circuit 135, according to embodiments of the present invention, may include more or less than eight switching elements, depending on the particular application and/or design considerations.

The first to fourth switching elements SW1 to SW4 may be coupled in parallel between a supply node SN1 of the first source ramp voltage VR1 and an output node ON of the ramp voltage VRAMP. The first to fourth switching elements SW1 to SW4 may be sequentially switched based on the first to fourth control signals S<1:4>. Each of the first to fourth control signals S<1:4> may be repeatedly generated for each coarse period, and may be sequentially activated or deactivated for each fine period.

The fifth to eighth switching elements SW5 to SW8 may be coupled in parallel between a supply node SN2 of the second source ramp voltage VR2 and the output node ON of the ramp voltage VRMAP. The fifth to eighth switching elements SW5 to SW8 may be sequentially switched based on first to fourth inverted control signals SB<1:4>. Each of the first to fourth inverted control signals SB<1:4> may be generated by inverting the first to fourth control signals S<1:4>.

The ramp voltage VRAMP may have a voltage level between the first source ramp voltage VR1 and the second source ramp voltage VR2. For example, when a relationship is formed as shown in FIG. 4, the ramp voltage VRMAP may have a voltage level defined as the following Equation 1.

$$VRAMP=(VR1-VR2)*(3/4)R+VR2 \quad \text{[Equation 1]}$$

In Equation 1, R represents a turn-on resistance value of each of the switching elements when the turn-on resistance values of the first to eighth switching elements SW1 to SW8 are the same.

An operation of the image sensing device 100 having the aforementioned structure is described with reference to FIG. 5.

Figure 5:
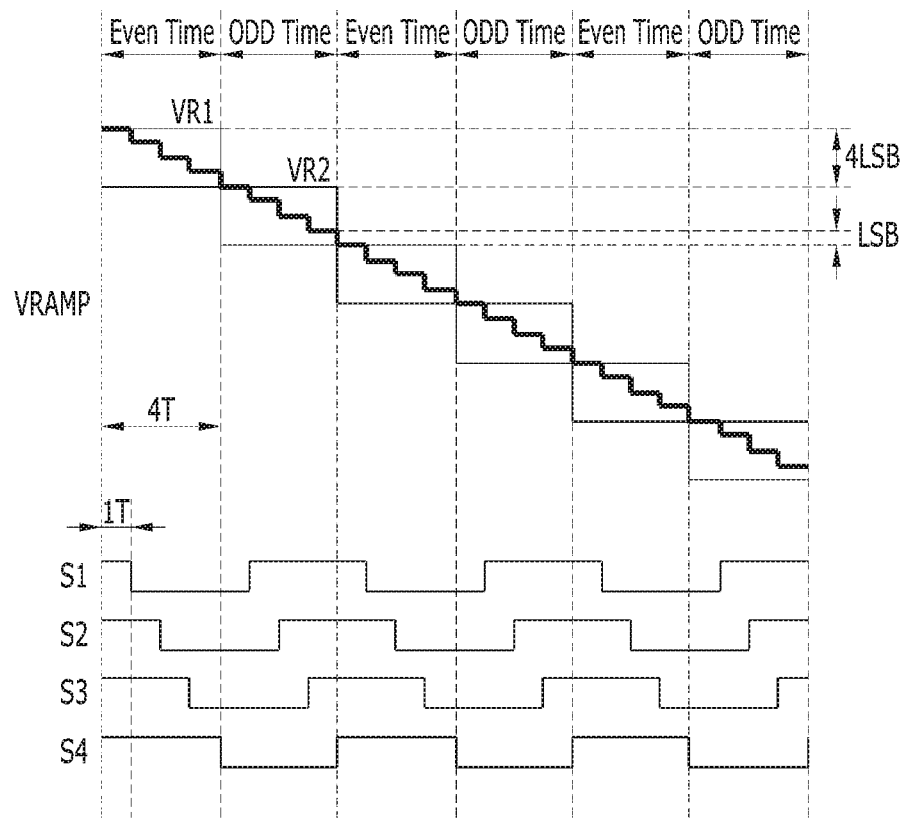
FIG. 5 is a timing diagram illustrating an operation of an image sensing device in accordance with an embodiment of the present invention.

FIG. 5 is a timing diagram illustrating an operation of an image sensing device in accordance with an embodiment of the present invention, for example, an operation of the image sensing device 100 shown in FIG. 1.

Referring to FIG. 5, the first source ramp voltage generation circuit 131 may generate the first source ramp voltage VR1 and the second source ramp voltage generation circuit 133 may generate the second source ramp voltage VR2. As shown, the first source ramp voltage VR1 decreases in units of a coarse voltage level 4LSB*2 for each coarse period 4T*2, and the second source ramp voltage VR2 decreases in units of the coarse voltage level 4LSB*2 for each coarse period 4T*2.

The first source ramp voltage VR1 and the second source ramp voltage VR2 may have a voltage level difference 4LSB corresponding to half of the coarse voltage level 4LSB*2 and have a phase difference 4T corresponding to half of the coarse period 4T*2. Accordingly, the first source ramp voltage VR1 may have a level that is greater than the second source ramp voltage VR2 by the voltage level difference 4LSB for a first half (or an even-numbered period, i.e., Even Time) of the coarse period 4T*2 and have a level that is less than the second source ramp voltage VR2 by the voltage level difference 4LSB for a second half (or an odd-numbered period, i.e., ODD Time) of the coarse period 4T*2.

The ramp voltage generation circuit 135 may generate the ramp voltage VRAMP that decreases in units of a fine voltage level 1LSB for each fine period 1T based on the first and second source ramp voltages VR1 and VR2 and the first to fourth control signals S<1:4>. More specifically, each of the first to fourth control signals S<1:4> may be repeatedly generated for each coarse period 4T*2, and be sequentially activated or deactivated for each fine period 1T. Accordingly, while the first and eighth switching elements are sequentially turned on or off for each fine period 1T, the ramp voltage VRAMP may be generated. The ramp voltage VRAMP has a voltage level between the first source ramp voltage VR1 and the second source ramp voltage VR2 and decreases in units of the fine voltage level 1LSB.

The pixel array 110 may output the first to $Y^{th}$ pixel signals VPX<1:Y>, and the signal converter 120 may generate the first to $Y^{th}$ image signals DOUT<1:Y> corresponding to the first to $Y^{th}$ pixel signals VPX<1:Y> based on the ramp voltage VRAMP and the first to $Y^{th}$ pixel signals VPX<1:Y>.

As is apparent from the foregoing description of embodiments of the present disclosure, an advantage is provided in that a finely-adjusted ramp voltage having a stable stepped waveform may be generated as two coarsely-adjusted source ramp voltages are processed through switching elements.

Such a ramp voltage may be advantageous for high-speed operation, and may improve operational reliability.

While the present invention has been described with respect to specific embodiments, the embodiments are not intended to be restrictive, but rather descriptive. Further, it is noted that the present invention may be implemented in various ways including through substitution, change, and/or modification of any of features of any of the disclosed embodiments, as would be apparent to those skilled in the art in light of the present disclosure, without departing from the spirit and/or scope of the present invention as defined by the following claims.

What is claimed is:

1. An image sensing device, comprising:
   a first source ramp voltage generation circuit suitable for generating a first source ramp voltage that is adjusted a first voltage unit for each first period;
   a second source ramp voltage generation circuit suitable for generating a second source ramp voltage that is adjusted the first voltage unit for each first period and has a set voltage difference from the first source ramp voltage; and
   a ramp voltage generation circuit suitable for generating a ramp voltage that is adjusted a second voltage unit that is less than the first voltage unit for each second period that is shorter than the first period based on the first and second source ramp voltages and a plurality of first control signals.

2. The image sensing device of claim 1, wherein the set voltage difference corresponds to half of the first voltage level.

3. The image sensing device of claim 1, wherein the first source ramp voltage and the second source ramp voltage have a set phase difference.

4. The image sensing device of claim 3, wherein the set phase difference corresponds to half of the first period.

5. The image sensing device of claim 1, wherein the first source ramp voltage has a level greater than that of the second source ramp voltage for an initial portion of the first period and has a level less than that of the second source ramp voltage for a last portion of the first period.

6. The image sensing device of claim 1, wherein the ramp voltage has a voltage level between the first source ramp voltage and the second source ramp voltage.

7. The image sensing device of claim 1, wherein the ramp voltage generation circuit includes:
   a plurality of first switching elements coupled in parallel between a supply node of the first source ramp voltage and an output node of the ramp voltage and sequentially controlled based on the plurality of first control signals; and
   a plurality of second switching elements coupled in parallel between a supply node of the second source ramp voltage and the output node of the ramp voltage and sequentially controlled based on a plurality of second control signals, which are inverted signals of the first control signals.

8. The image sensing device of claim 1, wherein the first control signals are repeatedly generated for each first period and sequentially activated or deactivated for each second period.

9. An image sensing device, comprising:
   a first source ramp voltage generation circuit suitable for generating a first source ramp voltage that is adjusted a coarse voltage unit for each coarse period and outputting the first source ramp voltage to a first supply node;
   a second source ramp voltage generation circuit suitable for generating a second source ramp voltage that is adjusted the coarse voltage unit for each coarse period and outputting the second source ramp voltage to a second supply node; and
   a ramp voltage generation circuit coupled between the first supply node and the second supply node, and suitable for generating a ramp voltage that is adjusted a fine voltage unit for each fine period based on a plurality of first control signals.

10. The image sensing device of claim 9, wherein the first source ramp voltage and the second source ramp voltage have a set voltage difference and a set phase difference.

11. The image sensing device of claim 10, wherein the set voltage difference corresponds to half of the coarse voltage level.

12. The image sensing device of claim 10, wherein the set phase difference corresponds to half of the coarse period.

13. The image sensing device of claim 9, wherein the first source ramp voltage has a level greater than that of the second source ramp voltage for an initial portion of the coarse period and has a level less than that of the second source ramp voltage for a last portion of the coarse period.

14. The image sensing device of claim 9, wherein the ramp voltage has a voltage level between the first source ramp voltage and the second source ramp voltage.

15. The image sensing device of claim 9, wherein the ramp voltage generation circuit includes:
   a plurality of first switching elements coupled in parallel between the first supply node and an output node of the ramp voltage and sequentially controlled based on the plurality of first control signals; and
   a plurality of second switching elements coupled in parallel between the second supply node and the output node of the ramp voltage and sequentially controlled based on a plurality of second control signals, which are inverted signals of the first control signals.

16. The image sensing device of claim 9, wherein the first control signals are repeatedly generated for each coarse period and sequentially activated or deactivated for each fine period.

17. An image sensing device, comprising:
   a pixel array suitable for generating a plurality of pixel signals;
   a ramp voltage generator suitable for generating a ramp voltage that has a voltage level between a first source ramp voltage and a second source ramp voltage and is adjusted a fine voltage unit for each fine period based on the first and second source ramp voltages, which are adjusted a coarse voltage unit for each coarse period; and
   a signal converter suitable for converting the pixel signals to a plurality of image signals based on the ramp voltage.

18. The image sensing device of claim 17, wherein the first source ramp voltage has a level greater than that of the second source ramp voltage for an initial portion of the coarse period and has a level less than the second source ramp voltage for a last portion of the coarse period.

19. The image sensing device of claim 17, wherein the ramp voltage generator includes:
   a first source ramp voltage generation circuit suitable for generating the first source ramp voltage and outputting the first source ramp voltage to a first supply node;
   a second source ramp voltage generation circuit suitable for generating the second source ramp voltage and outputting the second source ramp voltage to a second supply node; and
   a ramp voltage generation circuit coupled between the first supply node and the second supply node, and suitable for generating the ramp voltage based on a plurality of first control signals.

20. The image sensing device of claim 19, wherein the ramp voltage generation circuit includes:
   a plurality of first switching elements coupled in parallel between the first supply node and an output node of the ramp voltage and sequentially controlled based on the plurality of first control signals; and
   a plurality of second switching elements coupled in parallel between the second supply node and the output node of the ramp voltage and sequentially controlled based on a plurality of second control signals, which are inverted signals of the first control signals.

* * * * *